(12) United States Patent
Gu

(10) Patent No.: US 9,679,511 B2
(45) Date of Patent: Jun. 13, 2017

(54) SUBPIXEL ARRANGEMENT FOR DISPLAYS AND DRIVING CIRCUIT THEREOF

(71) Applicant: SHENZHEN YUNYINGGU TECHNOLOGY CO., LTD, Shenzhen (CN)

(72) Inventor: Jing Gu, Shanghai (CN)

(73) Assignee: SHENZHEN YUNYINGGU TECHNOLOGY CO., LTD. (CN)

( * ) Notice: Subject to any disclaimer, the term of this patent is extended or adjusted under 35 U.S.C. 154(b) by 0 days.

(21) Appl. No.: 14/692,869

(22) Filed: Apr. 22, 2015

(65) Prior Publication Data
US 2016/0275846 A1    Sep. 22, 2016

Related U.S. Application Data

(63) Continuation of application No. PCT/CN2015/074367, filed on Mar. 17, 2015.

(51) Int. Cl.
*G06F 3/038* (2013.01)
*G09G 5/00* (2006.01)
(Continued)

(52) U.S. Cl.
CPC ......... *G09G 3/2074* (2013.01); *G09G 3/3233* (2013.01); *G09G 2300/0426* (2013.01); *G09G 2300/0452* (2013.01)

(58) Field of Classification Search
CPC ...... G09G 3/2003; G09G 3/30–3/3426; G09G 3/3607; G09G 3/2074; G09G 2300/0426;
(Continued)

(56) References Cited

U.S. PATENT DOCUMENTS 6,404,410 B1 * 6/2002 Shirae .............................. 345/55
6,686,985 B1 * 2/2004 Tanaka et al. ................ 349/143
(Continued)

FOREIGN PATENT DOCUMENTS

CN    102866549 A    1/2013
CN    102903318 A    1/2013
(Continued)

OTHER PUBLICATIONS

International Search Report and Written Opinion mailed on Nov. 17, 2015 in International Application PCT/CN2015/074367.
(Continued)

*Primary Examiner* — Roberto Flores
(74) *Attorney, Agent, or Firm* — Sterne, Kessler, Goldstein and Fox P.L.L.C.

(57) ABSTRACT

An apparatus includes a display panel. In one example, the display panel includes an array of subpixels in a first, a second, and a third colors. Subpixels in the first, second, and third colors are alternatively arranged in every three adjacent rows of the array of subpixels. Every two adjacent rows of the array of subpixels are staggered with each other. A first subpixel in one of the first, second, and third colors and a second subpixel in a same color as the first subpixel are offset by 3 units in the horizontal axis and 4 units in the vertical axis. The first and second subpixels have a minimum distance among subpixels in the same color.

29 Claims, 9 Drawing Sheets

(51) Int. Cl.
  *G09G 3/20* (2006.01)
  *G09G 3/3233* (2016.01)

(58) Field of Classification Search
  CPC .. G09G 3/0439; G09G 3/0443; G09G 3/0452; G09G 3/0465; G09G 2340/0457; G09G 5/02; H01L 27/3218; H01L 27/3211; H01L 27/3216; H01L 27/326; H01L 27/3262; G02F 2001/134345; G02F 2001/134354; G02F 2001/52
  USPC ................................ 345/76–104, 204–215
  See application file for complete search history.

(56) References Cited

U.S. PATENT DOCUMENTS

| | | | |
|---|---|---|---|
| 8,044,905 B2* | 10/2011 | Kasahara | 345/92 |
| 8,786,645 B2 | 7/2014 | Gu | |
| 2002/0070909 A1* | 6/2002 | Asano et al. | 345/76 |
| 2003/0151574 A1* | 8/2003 | Chang et al. | 345/89 |
| 2003/0210218 A1* | 11/2003 | Hebiguchi | G09G 3/3648 345/90 |
| 2007/0229554 A1* | 10/2007 | Kawasaki et al. | 345/694 |
| 2008/0001525 A1* | 1/2008 | Chao et al. | 313/500 |
| 2008/0094530 A1* | 4/2008 | Ina et al. | 349/39 |
| 2008/0129670 A1* | 6/2008 | Ma | 345/88 |
| 2009/0015768 A1 | 1/2009 | Igeta et al. | |
| 2009/0140253 A1* | 6/2009 | Kasahara | H01L 27/1214 257/59 |
| 2010/0283714 A1* | 11/2010 | Cho | G09G 3/3607 345/90 |
| 2013/0002118 A1* | 1/2013 | Ko | 313/1 |
| 2013/0027437 A1* | 1/2013 | Gu | 345/690 |
| 2014/0145164 A1 | 5/2014 | Odaka et al. | |
| 2014/0307430 A1* | 10/2014 | Lo et al. | 362/231 |
| 2015/0015466 A1 | 1/2015 | Feng | |

FOREIGN PATENT DOCUMENTS

| | | |
|---|---|---|
| CN | 103123927 A | 5/2013 |
| CN | 103777393 A | 5/2014 |
| CN | 104282727 A | 1/2015 |
| CN | 104319283 A | 1/2015 |
| TW | 201503343 A | 1/2015 |
| WO | 2014114178 A1 | 7/2014 |
| WO | 2015090030 A1 | 6/2015 |

OTHER PUBLICATIONS

English-language abstract of Chinese Patent Application No. CN20121349262.

* cited by examiner

SUBPIXEL ARRANGEMENT FOR DISPLAYS AND DRIVING CIRCUIT THEREOF

CROSS REFERENCE TO RELATED APPLICATION

This application is continuation of International Application No. PCT/CN2015/074367, filed on Mar. 17, 2015, entitled "SUBPIXEL ARRANGEMENT FOR DISPLAYS AND DRIVING CIRCUIT THEREOF," which is hereby incorporated by reference in its entirety.

BACKGROUND

The disclosure relates generally to displays, and more particularly, to subpixel arrangement of displays and driving circuit thereof.

Displays are commonly characterized by display resolution, which is the absolute number of distinct pixels in each dimension that can be displayed (e.g., 1920×1080) or by display density (a.k.a. pixels per inch—PPI) concerning the relative numbers of pixels per inch. Many displays are, for various reasons, not capable of displaying different color channels at the same site. Therefore, the pixel grid is divided into single-color parts that contribute to the displayed color when viewed from a distance. In some displays, such as liquid crystal display (LCD), organic light-emitting diode (OLED) display, electrophoretic ink (E-ink) display, electroluminescent display (ELD), or light-emitting diode (LED) lamp display, these single-color parts are separately addressable elements, which are known as subpixels.

Various subpixel arrangements (layouts, schemes) have been proposed in order to improve the display quality by increasing the display density of a display and by anti-aliasing text with greater details. For example, LCDs typically divide each pixel into three strip subpixels (e.g., red, green, and blue subpixels) or four quadrate subpixels (e.g., red, green, blue, and white subpixels) so that each pixel can present brightness and a full color.

Compared with LCDs, it is even more difficult to increase the display density of OLED displays by reducing the size of individual subpixel because the organic light-emitting layers of OLEDs are fabricated by evaporation techniques using fine metal masks (FMMs). Due to the process accuracy for patterning organic materials using FMMs, the minimum size of each organic light-emitting layer is limited. Moreover, as all the OLEDs are formed in the same plane, sufficient spaces have to be maintained between adjacent subpixels to avoid overlapping of adjacent organic light-emitting layers. Therefore, the resolution of the conventional OLED display devices is limited by the process accuracy of the organic light-emitting layer and the planar structure of OLEDs.

SUMMARY

The disclosure relates generally to displays, and more particularly, to subpixel arrangement of displays and driving circuit thereof.

In one example, an apparatus includes a display panel. The display panel includes an array of subpixels in a first, a second, and a third colors. Subpixels in the first, second, and third colors are alternatively arranged in every three adjacent rows of the array of subpixels. Every two adjacent rows of the array of subpixels are staggered with each other. A first subpixel in one of the first, second, and third colors and a second subpixel in a same color as the first subpixel are offset by 3 units in the horizontal axis and 4 units in the vertical axis. The first and second subpixels have a minimum distance among subpixels in the same color.

In another example, an apparatus includes a display and control logic. The display includes a display panel having a light emitting layer and a driving circuit layer. The light emitting layer includes an array of OLEDs in a first, a second, and a third colors. The driving circuit layer includes an array of driving elements. Each driving element is configured to drive a respective OLED of the array of OLEDs. OLEDs in the first, second, and third colors are alternatively arranged in every three adjacent rows of the array of OLEDs. Every two adjacent rows of the array of OLEDs are staggered with each other. A first OLED in one of the first, second, and third colors and a second OLED in a same color as the first OLED are offset by 3 units in the horizontal axis and 4 units in the vertical axis. The first and second OLEDs have a minimum distance among OLEDs in the same color. The control logic is operatively coupled to the display and configured to receive display data and convert the display data into control signals for driving the array of OLEDs via the array of driving elements.

In still another example, an apparatus includes a display panel. The display panel includes an array of driving elements. Each driving element is configured to drive a respective subpixel of an array of subpixels on the display panel. Driving elements in each row of the array of driving elements are aligned. Driving elements in each column of the array of driving elements are aligned. Every two adjacent rows of the array of driving elements are offset by 4 units in the vertical axis. Every two adjacent columns of the array of driving elements are offset by 2 units in the horizontal axis.

BRIEF DESCRIPTION OF THE DRAWINGS

The embodiments will be more readily understood in view of the following description when accompanied by the below figures and wherein like reference numerals represent like elements, wherein.

DETAILED DESCRIPTION

Figure 1:
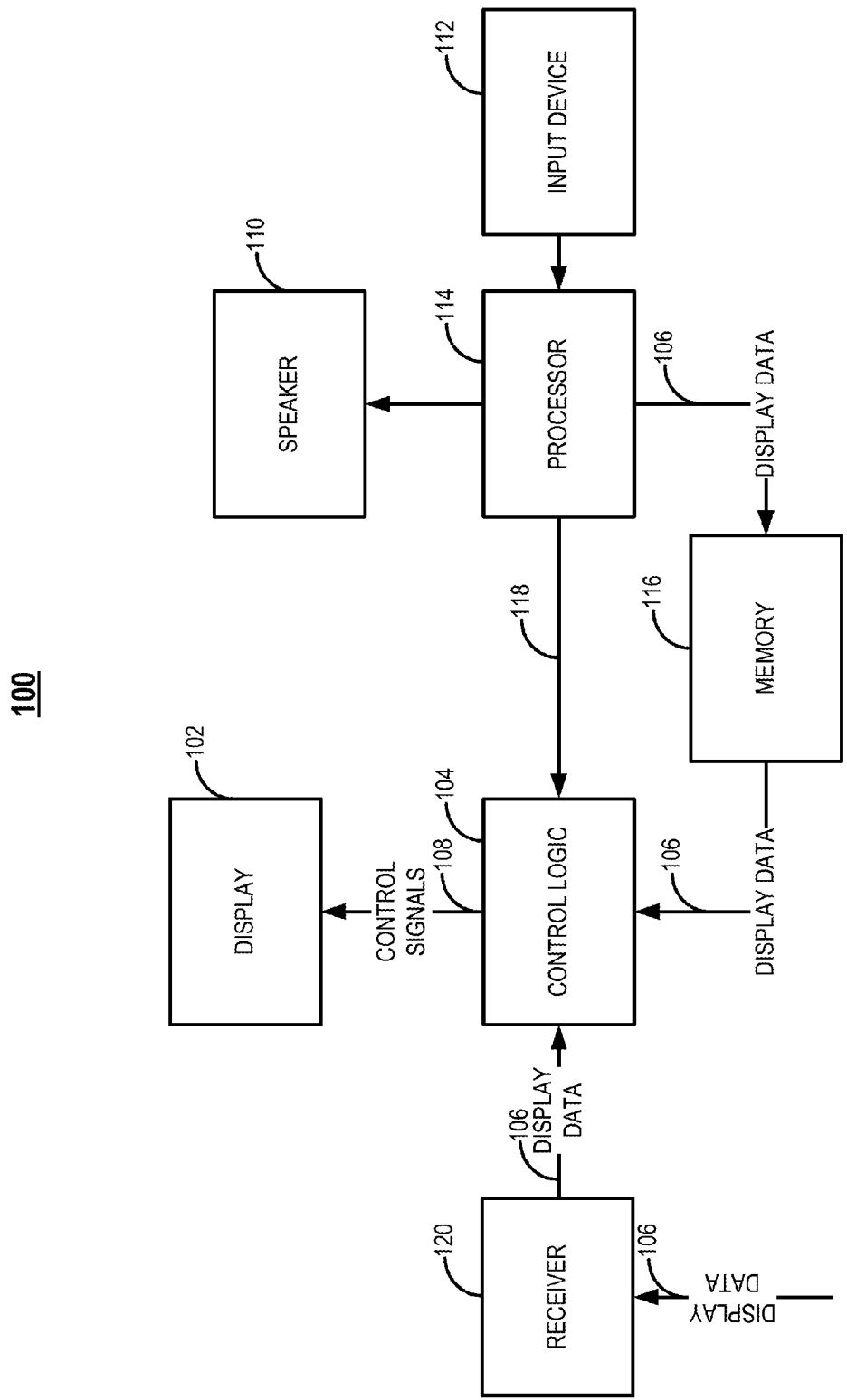
FIG. 1 is a block diagram illustrating an apparatus including a display and control logic in accordance with one embodiment set forth in the disclosure.

In the following detailed description, numerous specific details are set forth by way of examples in order to provide a thorough understanding of the relevant disclosures. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure.

Throughout the specification and claims, terms may have nuanced meanings suggested or implied in context beyond an explicitly stated meaning. Likewise, the phrase "in one embodiment/example" as used herein does not necessarily refer to the same embodiment and the phrase "in another embodiment/example" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As will be disclosed in detail below, among other novel features, the novel subpixel and driving element arrangements disclosed in the present disclosure provide the ability to increase the minimum distances among subpixels in the same and different colors, thereby overcoming the limitations of mask-based organic materials evaporation techniques and ensuring the relative high yield. On the other hand, the novel subpixel and driving element arrangements can reduce the number of subpixels in the same display area, while maintaining the same apparent display resolution compared with known arrangements, such as the standard "delta" arrangement, thereby reducing the cost and power consumption of the display.

Additional novel features will be set forth in part in the description which follows, and in part will become apparent to those skilled in the art upon examination of the following and the accompanying drawings or may be learned by production or operation of the examples. The novel features of the present disclosure may be realized and attained by practice or use of various aspects of the methodologies, instrumentalities, and combinations set forth in the detailed examples discussed below.

FIG. 1 illustrates an apparatus 100 including a display 102 and control logic 104. The apparatus 100 may be any suitable device, for example, a television set, laptop computer, desktop computer, netbook computer, media center, handheld device (e.g., dumb or smart phone, tablet, etc.), wearable devices (e.g., eyeglasses, wrist watch, etc.), global positioning system (GPS), electronic billboard, electronic sign, gaming console, set-top box, printer, or any other suitable device. In this example, the display 102 is operatively coupled to the control logic 104 and is part of the apparatus 100, such as but not limited to, a television screen, computer monitor, dashboard, head-mounted display, electronic billboard, or electronic sign. The display 102 may be an LCD, OLED display, E-ink display, ELD, billboard display with LED or incandescent lamps, or any other suitable type of display.

The control logic 104 may be any suitable hardware, software, firmware, or combination thereof, configured to receive display data 106 and render the received display data 106 into control signals 108 for driving the subpixels of the display 102. The control signals 108 are used for controlling writing of subpixels and directing operations of the display 102. As described below in detail with respect to FIG. 7, the control logic 104 may include a timing controller, a gate driving module, and a source driving module. The control logic 104 may include any other suitable components, including an encoder, a decoder, one or more processors, controllers, and storage devices. The control logic 104 may be implemented as a standalone integrated circuit (IC) chip, such as a field-programmable gate array (FPGA) or an application-specific integrated circuit (ASIC). The apparatus 100 may also include any other suitable component such as, but not limited to, a speaker 110 and an input device 112, e.g., a mouse, keyboard, remote controller, handwriting device, camera, microphone, scanner, etc.

In one example, the apparatus 100 may be a laptop or desktop computer having a display 102. In this example, the apparatus 100 also includes a processor 114 and memory 116. The processor 114 may be, for example, a graphic processor (e.g., GPU), a general processor (e.g., APU, accelerated processing unit; GPGPU, general-purpose computing on GPU), or any other suitable processor. The memory 116 may be, for example, a discrete frame buffer or a unified memory. The processor 114 is configured to generate display data 106 in display frames and temporally store the display data 106 in the memory 116 before sending it to the control logic 104. The processor 114 may also generate other data, such as but not limited to, control instructions 118 or test signals, and provide them to the control logic 104 directly or through the memory 116. The control logic 104 then receives the display data 106 from the memory 116 or from the processor 114 directly.

In another example, the apparatus 100 may be a television set having a display 102. In this example, the apparatus 100 also includes a receiver 120, such as but not limited to, an antenna, radio frequency receiver, digital signal tuner, digital display connectors, e.g., HDMI, DVI, DisplayPort, USB, Bluetooth, WiFi receiver, or Ethernet port. The receiver 120 is configured to receive the display data 106 as an input of the apparatus 100 and provide the native or modulated display data 106 to the control logic 104.

In still another example, the apparatus 100 may be a handheld device, such as a smart phone or a tablet. In this example, the apparatus 100 includes the processor 114, memory 116, and the receiver 120. The apparatus 100 may both generate display data 106 by its processor 114 and receive display data 106 through its receiver 120. For example, the apparatus 100 may be a handheld device that works as both a mobile television and a mobile computing device. In any event, the apparatus 100 at least includes the display 102 with specifically designed subpixel and driving element arrangements as described below in detail.

Figure 2:
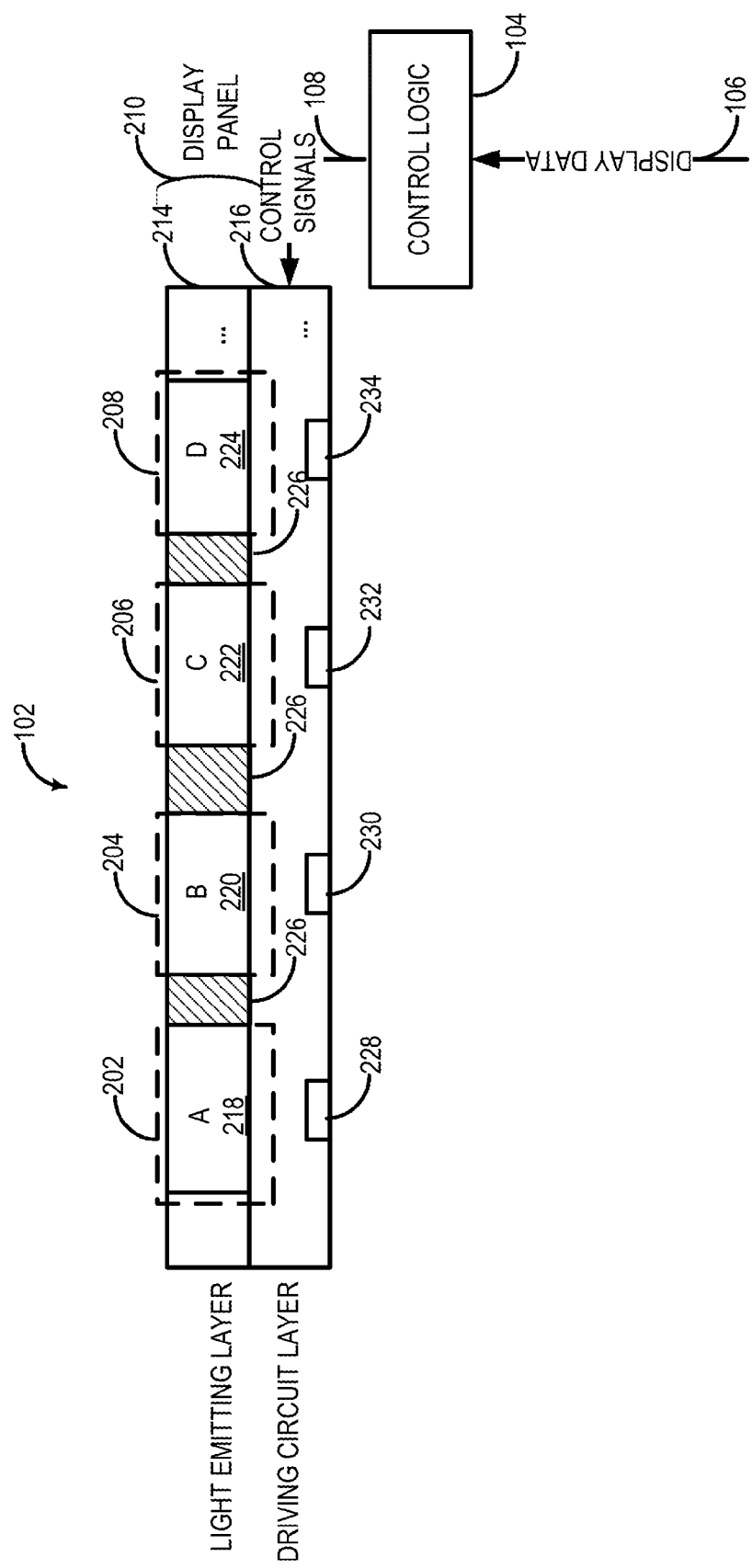
FIG. 2 is a side-view diagram illustrating one example of the display shown in FIG. 1 in accordance with one embodiment set forth in the disclosure.

FIG. 2 is a side-view diagram illustrating one example of a display 102 including a group of subpixels 202, 204, 206, 208. The display 102 may be any suitable type of display, for example, OLED displays, such as an active-matrix (AM) OLED display, passive-matrix (PM) OLED display, or any other suitable display. The display 102 may include a display panel 210 operatively coupled to the control logic 104.

In this example, the display panel 210 includes a light emitting layer 214 and a driving circuit layer 216. As shown in FIG. 2, the light emitting layer 214 includes a plurality of OLEDs 218, 220, 222, 224, corresponding to the plurality of subpixels 202, 204, 206, 208, respectively. A, B, C, and D in FIG. 2 denote OLEDs in four different colors, such as but not limited to, red, green, blue, yellow, cyan, magenta, or white. The light emitting layer 214 also includes a black matrix 226 disposed between the OLEDs 218, 220, 222, 224, as shown in FIG. 2. The black matrix 226, as the borders of the subpixels 202, 204, 206, 208, is used for blocking lights coming out from the parts outside the OLEDs 218, 220, 222, 224. Each OLED 218, 220, 222, 224 in the light emitting layer 214 can emit light in a predetermined color and brightness. In this example, the driving circuit layer 216 includes a plurality of driving elements 228, 230, 232, 234, each of which includes one or more thin film transistors (TFTs), corresponding to the plurality of OLEDs 218, 220, 222, 224 of the plurality of subpixels 202, 204, 206, 208, respectively. The driving elements 228, 230, 232, 234 may be individually addressed by the control signals 108 from the control logic 104 and are configured to drive the corresponding subpixels 202, 204, 206, 208, by controlling the light emitting from the respective OLEDs 218, 220, 222, 224, according to the control signals 108. The display panel 210 may include any other suitable component, such as one or more glass substrates, polarization layers, or a touch panel, as known in the art.

As shown in FIG. 2, each of the plurality of subpixels 202, 204, 206, 208 is formed by at least an OLED driven by a corresponding driving element. Each OLED may be formed by a sandwich structure of an anode, an organic light-emitting layer, and a cathode, as known in the art. Depending on the characteristics (e.g., material, structure, etc.) of the organic light-emitting layer of the respective OLED, a subpixel may present a distinct color and brightness. Although FIG. 2 is illustrated as an OLED display, it is understood that it is provided for an exemplary purpose only and without limitations.

Figure 3:
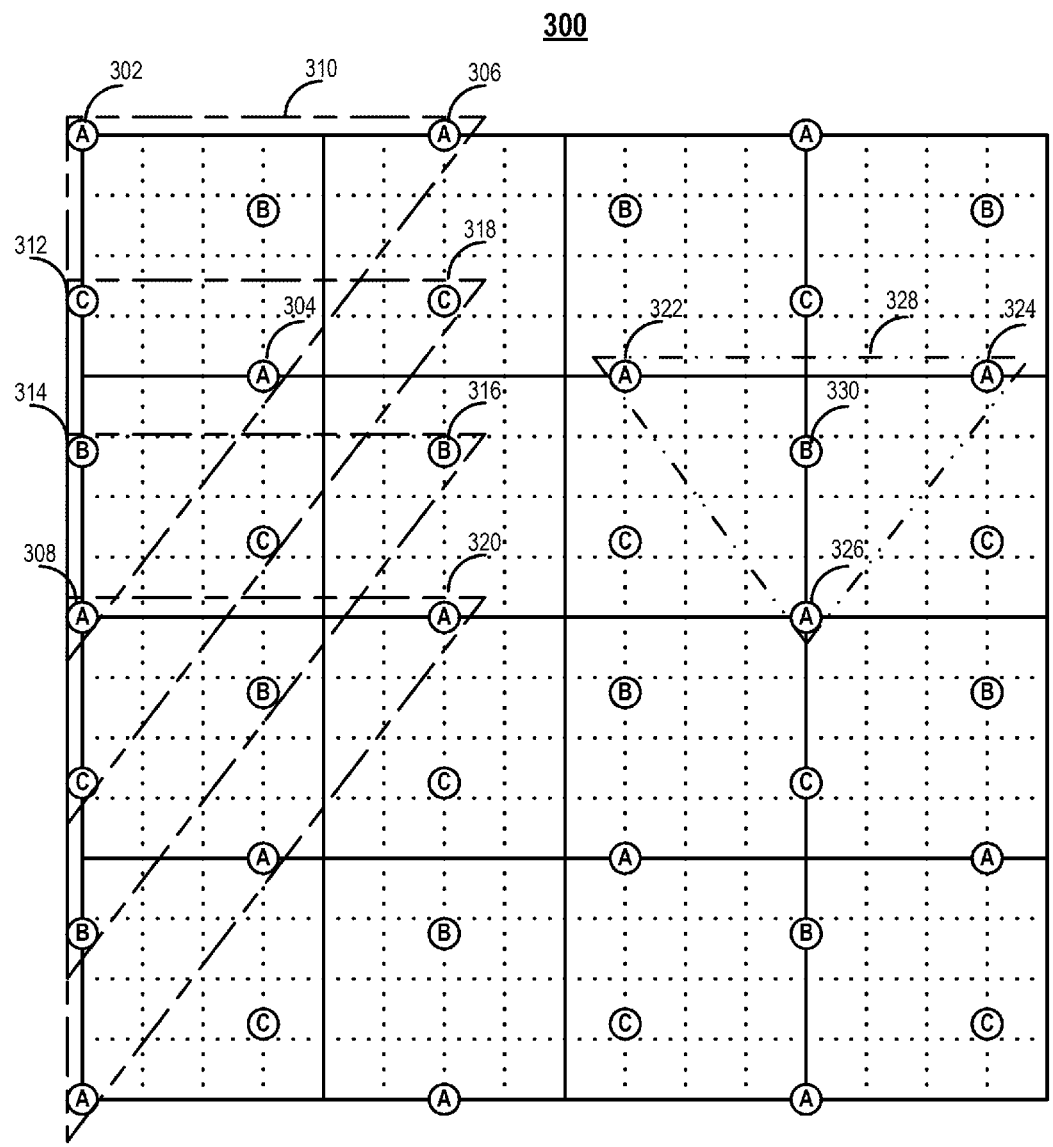
FIG. 3 is a depiction of a subpixel arrangement of a display in accordance with one embodiment set forth in the disclosure.

FIG. 3 depicts a subpixel arrangement of a display in accordance with one embodiment set forth in the disclosure. FIG. 3 may be, for example, a plan-view of the display 102 and depicts one example of subpixel arrangements of the display 102. The display 102 includes an array 300 of subpixels in three different colors, A, B, and C (represented by each dot in FIG. 3) arranged in a regular pattern. A, B, and C in FIG. 3 denote three different colors, such as but not limited to, red, green, blue, yellow, cyan, magenta, or white. The shape of each subpixel is not limited and may include, for example, rectangular, square, circle, triangular, etc. The array 300 of subpixels may have the same shape or different shapes in various examples. The size of each subpixel may be the same or different in various examples.

As shown in FIG. 3, subpixels A, subpixels B, and subpixels C are alternatively arranged in every three adjacent rows of the array 300 of subpixels. For example, the first row of the array 300 (from the top of the array 300) includes only subpixels A, the second row of the array 300 includes only subpixels B, and the third row of the array 300 includes only subpixels C. The same pattern is repeated for the next three adjacent rows of the array 300, i.e., rows 4-6, and goes on and on. In other words, all subpixels A are arranged in rows $3n+1$, all subpixels B are arranged in rows $3n+2$, and all subpixels C are arranged in rows $3n+3$ ($n=0, 1, 2, 3, \ldots$).

As shown in FIG. 3, every two adjacent rows of the array 300 of subpixels are staggered with each other. That is, subpixels in every two adjacent rows are not aligned with each other in the vertical axis (directions of columns of the array 300), but instead, are shifted by a distance in the horizontal axis (directions of rows of the array 300). For example, subpixels B in the second row of the array 300 are not aligned with subpixels A in the first row of the array 300, but instead, are offset from the subpixels A in the first row by a distance (will be described below in detail) to the right. Similarly, subpixels C in the third row of the array 300 are offset from the subpixels B in the second row of the array 300 by the same distance to the left. The same pattern is repeated for every two adjacent rows of the array 300. As shown in FIG. 3, subpixels in odd rows (e.g., rows 1, 3, 5, . . . ) are aligned with each other in the vertical axis, and subpixels in even rows (e.g., rows 2, 4, 6, . . . ) are aligned with each other in the vertical axis. It is understood that even if two subpixels have different sizes and/or shapes, they are considered as being "aligned" if the geometric centers of the two subpixels are aligned vertically or horizontally.

The relative distances between two subpixels in the same color (e.g., A-A, B-B, or C-C) and two subpixels in the different colors (e.g., A-B, B-C, C-A) are now discussed with respect to FIG. 3. Taking subpixels A for example (and the same can be applied to subpixels B and subpixels C), two subpixels A 302, 304 are in the adjacent rows (rows 1 and 4) and adjacent columns (columns 1 and 2) in which subpixels in this color A are arranged (no subpixels A are arranged in rows 2 and 3). As shown in FIG. 3, subpixel A 302 and subpixel A 304 are offset by 3 units (indicated by the dashed grid) in the horizontal axis and 4 units (indicated by the dashed grid) in the vertical axis. The distance between subpixel A 302 and subpixel A 304 is thus 5 units according to Pythagorean theorem. It is understood that the distance and/or offset between two subpixels is calculated based on the geometric centers of the two subpixels, regardless of the size/or shape thereof.

Subpixel A 306 is another subpixel with the same color as subpixel A 302 and that is geometrically close to subpixel A 302. Subpixel A 302 and subpixel A 306 are in the same row and have the minimum distance among all subpixels A in that row. As shown in FIG. 3, subpixel A 302 and subpixel A 306 are offset by 6 units in the horizontal axis and 0 unit in the vertical axis (i.e., they are in the same row). In other words, adjacent subpixels in the same row are spaced apart by 6 units from each other. The distance between subpixel A 302 and subpixel A 306 is 6 units. Subpixel A 308 is still another subpixel with the same color as subpixel A 302 and that is geometrically close to subpixel A 302. Subpixel A 302 and subpixel A 308 are in the same column and have the minimum distance among all subpixels A in that column. As shown in FIG. 3, subpixel A 302 and subpixel A 308 are offset by 8 units in the vertical axis and 0 unit in the horizontal axis (i.e., they are in the same column). In other words, adjacent subpixels in the same color in the same column are spaced apart by 8 units from each other. The distance between subpixel A 302 and subpixel A 308 is 8 units.

Accordingly, in the array 300 of subpixels shown in FIG. 3, the minimum distance between any two of the subpixels in the same color (e.g., A-A, B-B, or C-C) is thus 5 units (e.g., the distance between subpixel A 302 and subpixel A 304). In other words, according to the novel subpixel arrangement shown in FIG. 3, two subpixels in the adjacent rows and adjacent columns in which subpixels in their color are arranged have the minimum distance between any two subpixels in the same color. Those two subpixels are offset by 3 units in the horizontal axis and 4 units in the vertical axis. It is noted that the "unit" referred herein in the present disclosure is not limited by any actual values (e.g., 1 nm, 1 µm, 1 mm, etc.). For example, the array 300 in FIG. 3 has a size of 16 units by 16 units. Depending on the actual size of the array 300 in various examples in practice, each unit may represent different values. The "unit" referred in the present disclosure, however, can be used for representing relative values between different distances or offsets. For example, "two subpixels are offset by 3 units in the horizontal axis and 4 units in the vertical axis" can be interpreted as that the ratio of horizontal offset and vertical offset between two subpixels is 3/4. Similarly, although the distance of 5 units between subpixel A 302 and subpixel 304 is not limited to any actual value of distance, it can be compared with the distance of 6 units between subpixel A 302 and subpixel 306, e.g., the ratio of the two distances is 5/6.

As shown in FIG. 3, the four subpixels A 302, 304, 306, 308 form a repeating group 310 for subpixels in color A. The repeating group A 310 is tiled across the display panel in a regular pattern. That is, the repeating group A 310 repeats itself in the horizontal axis with a pitch of 6 units and in the vertical axis with pitch of 8 units. Like the repeating group A 310, repeating group B 316 and repeating group C 318 can be formed by subpixels B and subpixels C, respectively, in the same manner. Each of the repeating group B 316 and repeating group C 318 repeats itself in the horizontal axis with a pitch of 6 units and in the vertical axis with pitch of 8 units.

As shown in FIG. 3, subpixel C 312 and subpixel B 314 between the two subpixels A 302, 308 in the same column evenly divide the distance of 8 units between the two subpixels A 302, 308. Thus, the distance (i.e., vertical offset) between the subpixel A 302 and the subpixel C 312 is 8/3 units, and the distance (i.e., vertical offset) between the subpixel A 302 and the subpixel B 314 is 16/3 units. In other words, adjacent subpixels in the same column are spaced apart by 8/3 units from each other regardless of their colors. Thus, another way to look at the repeating groups in different colors is that the repeating group in the first color and each of the other two repeating groups in the second and third colors are offset by 8/3 units in the vertical axis and 0 unit in the horizontal axis, respectively, and that the two repeating groups in the second and third colors are offset from the repeating group in the first color in opposite directions of the vertical axis. As shown in FIG. 3, from repeating group B 316's perspective, repeating group C 318 is offset by 8/3 in the upward direction of the vertical axis, while repeating group A 320 is offset by 8/3 in the downward direction of the vertical axis.

As shown in FIG. 3, for example, two adjacent subpixels A 322, 324 in the same row and another subpixel A 326 form an isosceles triangle. Subpixel B 330 is inside the isosceles triangle. The distance between subpixel B 330 and subpixel A 326 is 8/3 units as discussed above. The distance between subpixel B 330 and each of subpixels A 322, 324 is thus $\sqrt{97}/3$ units according to Pythagorean theorem, which is larger than 8/3 units. Accordingly, the minimum distance between any two subpixels in the different colors (e.g., A-B, B-C, or C-A) is thus 8/3 units. In other words, according to the novel subpixel arrangement shown in FIG. 3, two adjacent subpixels in the same column have the minimum distance between any two subpixels in the different colors. As discussed above, the minimum distance between any two subpixels in the same color is 5 units. It is known that the minimum distances between any two subpixels in the same and different colors are 4 and 2.4 units, respectively, for the standard "delta" arrangement. Thus, the novel subpixel arrangement disclosed in FIG. 3 increases both minimum distances compared with the standard "delta" arrangement, thereby leaving more margins for mask-based organic materials evaporation techniques and ensuring the relative high yield. In addition, due to the relative distance changes among subpixels compared with the standard "delta" arrangement, fewer subpixels are needed in the same display area by the novel subpixel arrangement disclosed in FIG. 3.

In this embodiment, each of the subpixels of the array 300 includes an OLED. Thus, the array 300 of subpixels can be considered as an array of OLEDs as well. Each OLED emits one of the red, green, and blue lights and has a substantially rectangular shape. However, it is understood that the shape of each OLED in other examples may vary. Other shapes of the OLEDs include, but are not limited to, substantially round, triangle, square, pentagon, hexagon, heptagon, octagon, or any other suitable shape. It is understood that the subpixels are not limited to OLEDs and may be, for example, LEDs of a billboard display with LED lamps or any other suitable display devices as known in the art. Although subpixels/OLEDs in three colors (A, B, and C) are described in FIG. 3, subpixels/OLEDs in four or more colors may be included in other examples.

It is understood that by changing the relative positions between subpixels in different colors, i.e., the relative positions between repeating groups in different colors, the minimum distance between any two subpixels in the different colors may be changed accordingly. The minimum distance between any two subpixels in the different colors is 8/3 units in FIG. 3 when the repeating group in the first color and each of the other two repeating groups in the second and third colors are offset by 8/3 units in opposite directions of the vertical axis and 0 unit in the horizontal axis. Such minimum distance may be increased by further adjusting the horizontal offset and/or vertical offsets between repeating groups in the different colors, e.g., by adding an additional offset to the initial offset of 8/3 units, as discussed below in FIG. 4.

Figure 4:
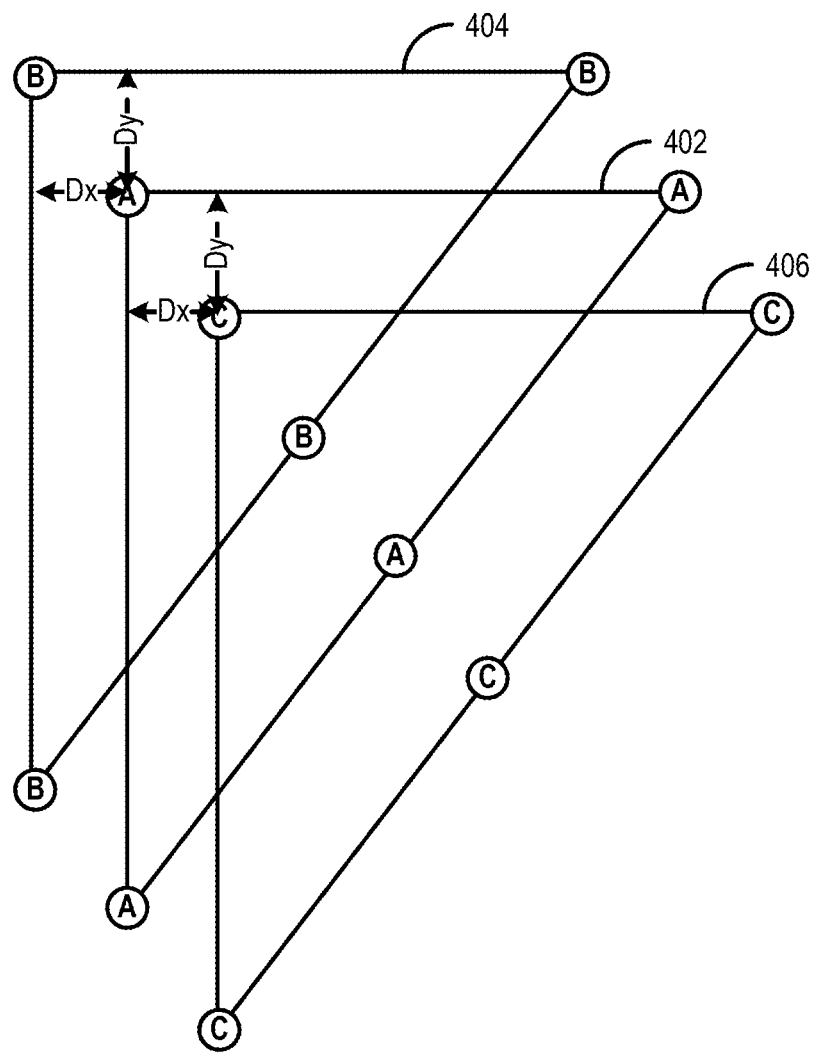
FIG. 4 is a depiction of three repeating groups and their relative positions in accordance with one embodiment set forth in the disclosure.

FIG. 4 is a depiction of three repeating groups and their relative positions in accordance with one embodiment set forth in the disclosure. As shown in FIG. 4, repeating groups 402, 404, 406 are formed by subpixels in colors A, B, and C, respectively, as discussed above in FIG. 3. From repeating group A 402's perspective, assuming repeating group B 404 has an initial offset of 8/3 units in the upward direction of the vertical axis, and repeating group C 406 has an initial offset of 8/3 units in the downward direction of the vertical axis, just like in the embodiment in FIG. 3. On that basis, the relative positions among repeating group A 402, repeating group B 404, and repeating group C 406 can be further adjusted with additional offsets to increase the minimum distance between any two subpixels in the different colors. Dx and Dy represent the amount of total offsets including additional offset and the initial offset (as shown in FIG. 3) in the horizontal axis and vertical axis, respectively.

In one example, repeating group B 404 is further offset from repeating group A 402 by 0.0209 units (additional offset) in the upward direction of the vertical axis in addition to the initial offset of 8/3 units. That is, Dy is equal to (8/3+0.0209) units for repeating group B 404 with respect to repeating group A 402. Repeating group C 406 is further offset from repeating group A 402 by 0.0209 units (additional offset) in the downward direction of the vertical axis in addition to the initial offset of 8/3 units. That is, Dy is equal to (8/3+0.0209) units for repeating group C 406 with respect to repeating group A 402. In this example, repeating group B 404 and repeating group C 406 are also offset from repeating group A 402 in the horizontal axis. Although FIG. 4 shows that repeating group B 404 is offset from repeating group A 402 in the leftward direction of the horizontal axis and repeating group C 406 is offset from repeating group A 402 in the rightward direction of the horizontal axis, it is understood that their additional offset directions in the horizontal axis can be reversed because their initial offset (as shown in FIG. 3) in the horizontal axis is 0 unit. That is, Dx is equal to 0.3334 units for each of repeating group B 404 and repeating group C 406 with respect to repeating group A 402.

When Dy is equal to (8/3+0.0209) units and Dx is equal to 0.3334 units, it can be found that the minimum distance between any two subpixels in the different colors is increased from 8/3 units to about 2.7082 units. It can also be found that in theory, the minimum distance between any two subpixels in the different colors is a bit larger than 2.7082 units. In this embodiment, the relative positions between subpixels in the same color do not change compared with the embodiment of FIG. 3 as they are limited by each repeating group itself. Thus, the minimum distance between any two subpixels in the same color is still 5 units.

Figure 5:
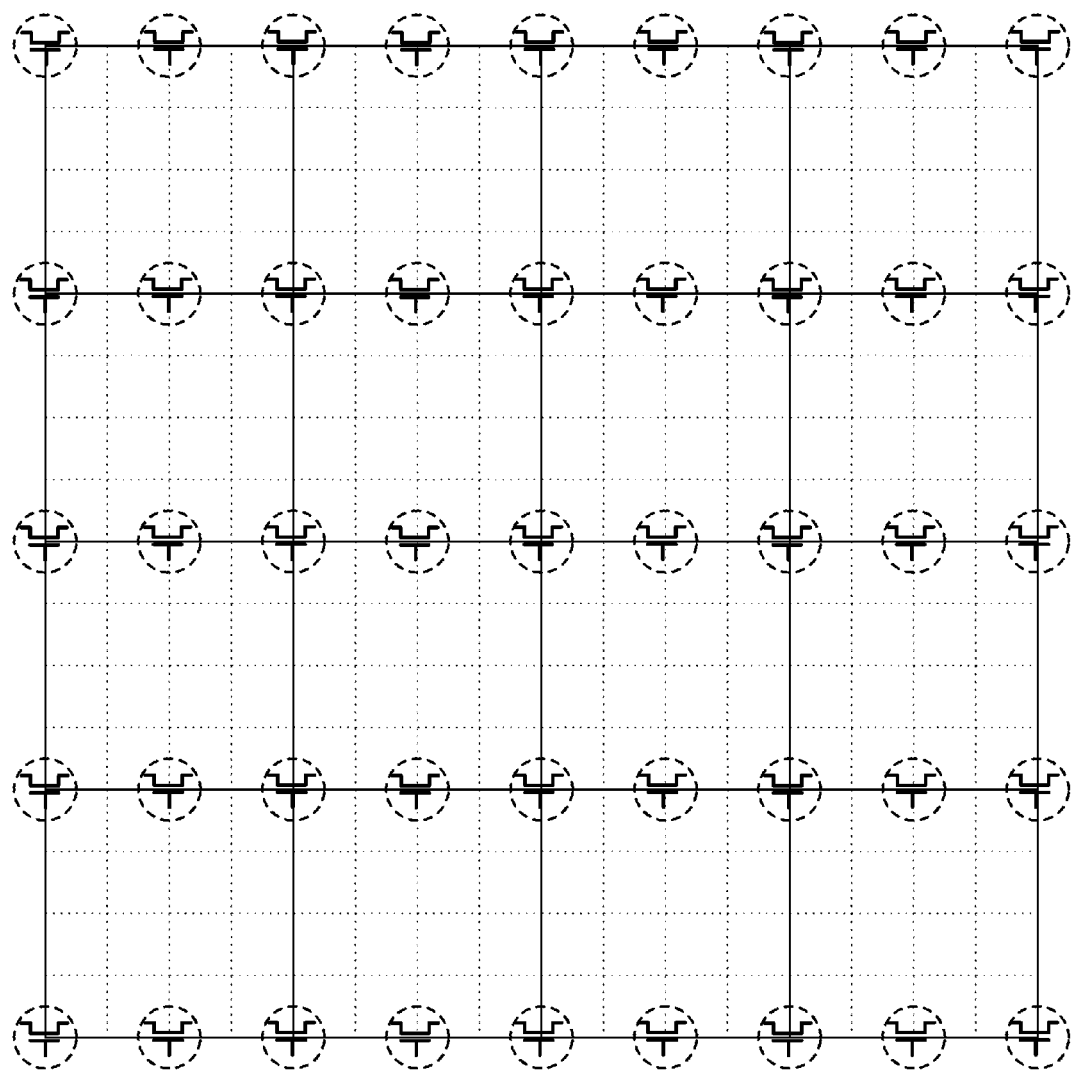
FIG. 5 is a depiction of a driving element arrangement of a display in accordance with one embodiment set forth in the disclosure.

FIG. 5 is a depiction of a driving element arrangement of a display in accordance with one embodiment set forth in the disclosure. As discussed above, each subpixel (e.g., an OLED) is driven by a corresponding driving element in the driving circuit layer 216 of the display panel 210. That is, the display panel 210 includes an array of driving elements for driving the array of subpixels. The arrangement of the array of driving elements is not necessary to be the same as that of the array of subpixels. FIG. 5 may be, for example, a plan-view of the display 102 and depicts one example of driving element arrangements of the display 102. Each of the dashed circles in FIG. 5 represents one driving element of the array 500 of driving elements, each of which includes one or more TFTs.

As shown in FIG. 5, driving elements in the array 500 are in line with each other in both the horizontal axis and vertical axis. That is, driving elements in each row of the array 500 of driving elements are aligned, and driving elements in each column of the array 500 of driving elements are aligned as well. In this embodiment, every two adjacent rows of the array 500 of driving elements are offset by 4 units in the vertical direction, and every two adjacent columns of the array 500 of driving elements are offset by 2 units in the horizontal direction.

Figure 6:
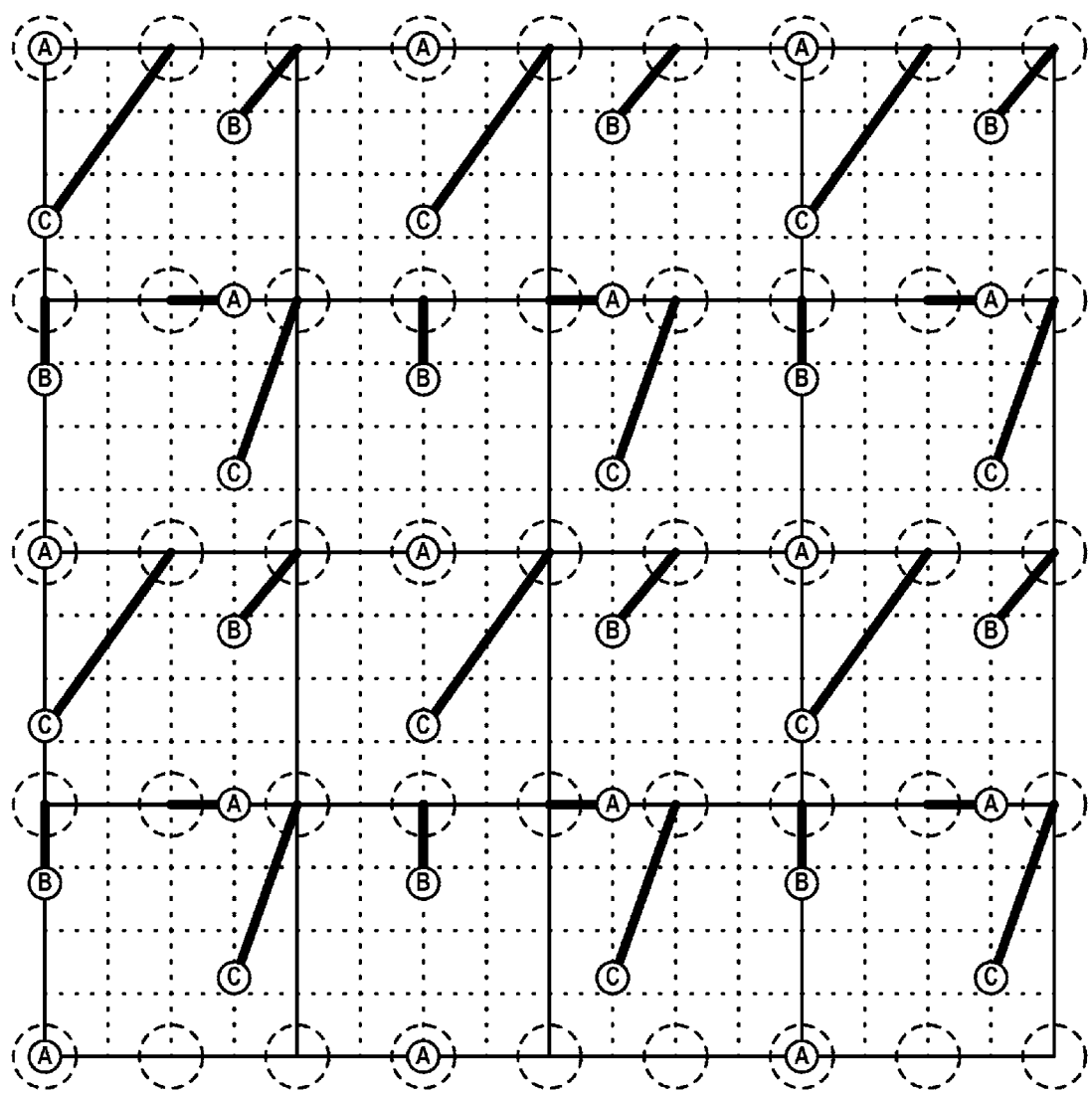
FIG. 6 is a depiction of electrical connections between subpixels and driving elements of a display in accordance with one embodiment set forth in the disclosure.

FIG. 6 is a depiction of electrical connections between subpixels and driving elements of a display in accordance with one embodiment set forth in the disclosure. The subpixel arrangement shown in FIG. 3 and the driving element arrangement shown in FIG. 5 are combined in this embodiment. As discussed above, for OLED displays, each driving element is electrically connected to a respective OLED to control the current passing through the OLED. For example, a wire connects the drain electrode of a TFT to the anode of a respective OLED. Each thick line in FIG. 6 represents the electrical connection between a driving element (represented by a dashed circle) and a respective OLED (represented by a dot). As shown in FIG. 6, the upper-left OLED A is aligned with the upper-left driving element. The relative positions of the rest of the OLEDs and driving elements are thus fixed based on the descriptions above with respect to FIGS. 3 and 5.

As shown in FIG. 6, OLEDs A in the first row from the top are aligned with respective driving elements in the same row (i.e., each of the (3n+1)th driving elements in that row, n=0, 1, 2, 3, . . . ), and thus, no extra electrical connection may be needed. Each of the (3n+2)th (n=0, 1, 2, 3, . . . ) driving elements in the first row of the array 500 of driving elements is configured to drive a respective OLED C in the third row of the array 300 of subpixels (e.g., OLEDs). Each of the (3n+3)th (n=0, 1, 2, 3, . . . ) driving elements in the first row of the array 500 of driving elements is configured to drive a respective OLED B in the second row of the array 300 of subpixels (e.g., OLEDs). In other words, the driving elements in the first row of the array 500 are configured to drive OLEDs in alternated colors A, C, and B. For the second row of the array 500 of driving elements, each of the (3n+1)th (n=0, 1, 2, 3, . . . ) driving elements in the second row of the array 500 is configured to drive a respective OLED B in the fifth row of the array 300 of subpixels (e.g., OLEDs). Each of the (3n+2)th (n=0, 1, 2, 3, . . . ) driving elements in the second row of the array 500 is configured to drive a respective OLED A in the fourth row of the array 300 of subpixels (e.g., OLEDs). Each of the (3n+3)th (n=0, 1, 2, 3, . . . ) driving elements in the second row of the array 500 is configured to drive a respective OLED C in the sixth row of the array 300 of subpixels (e.g., OLEDs). In other words, the driving elements in the second row of the array 500 are configured to drive OLEDs in alternated colors B, A, and C. The same pattern described above is repeated for the rest of the OLEDs and driving elements. Driving elements in each row of the array 500 of driving elements are configured to drive a same number of subpixels in the first, second, and third colors. In the example of FIG. 6, ⅓ of the driving elements in each row of the array 500 are configured to drive OLEDs A, ⅓ of the driving elements in each row of the array 500 are configured to drive OLEDs B, and ⅓ of the driving elements in each row of the array 500 are configured to drive OLEDs C.

As shown in FIG. 6, OLEDs A in the first column from the left are aligned with respective driving elements in the same column (i.e., each odd driving element in that column), and thus, no extra electrical connection may be needed. Each even driving element in the first column of the array 500 of driving elements is configured to drive a respective OLED B in the first column of the array 300 of subpixels (e.g., OLEDs). In other words, the driving elements in the first column of the array 500 are configured to drive OLEDs in alternated colors A and B. For the second column of the array 500 of driving elements, each odd driving element in the second column of the array 500 is configured to drive a respective OLED C in the first column of the array 300 of subpixels (e.g., OLEDs). Each even driving element in the second column of the array 500 is configured to drive a respective OLED A in the second column of the array 300 of subpixels (e.g., OLEDs). In other words, the driving elements in the second column of the array 500 are configured to drive OLEDs in alternated colors C and A. For the third column of the array 500 of driving elements, each odd driving element in the third column of the array 500 is configured to drive a respective OLED B in the second column of the array 300 of subpixels (e.g., OLEDs). Each even driving element in the third column of the array 500 is configured to drive a respective OLED C in the second column of the array 300 of subpixels (e.g., OLEDs). In other words, the driving elements in the third column of the array 500 are configured to drive OLEDs in alternated colors B and C. The same pattern described above is repeated for the rest of the OLEDs and driving elements. Driving elements in each column of the array 500 of driving elements are configured to drive a same number of subpixels in two colors of the first, second, and third colors. In the example of FIG. 6, ½ of the driving elements in each (3n+1)th (n=0, 1, 2, 3, . . . ) column of the array 500 are configured to drive OLEDs A, and ½ of the driving elements in each (3n+1)th (n=0, 1, 2, 3, . . . ) column of the array 500 are configured to drive OLEDs B. Similarly, ½ of the driving elements in each (3n+2)th (n=0, 1, 2, 3, . . . ) column of the array 500 are configured to drive OLEDs C, and ½ of the driving elements in each (3n+2)th (n=0, 1, 2, 3, . . . ) column of the array 500 are configured to drive OLEDs A. ½ of the driving elements in each (3n+3)th (n=0, 1, 2, 3, . . . ) column of the array 500 are configured to drive OLEDs B, and ½ of the driving elements in each (3n+3)th (n=0, 1, 2, 3, . . . ) column of the array 500 are configured to drive OLEDs C.

It can be seen from FIG. 6 that most of the electrical connections are along the upper-right to lower-left direction, which indicates that the array 500 of driving elements is in the upper-right relative to the array 300 of subpixels. It some embodiments, the upper-left driving element and OLED are not aligned as in this embodiment. Instead, the array 500 of driving elements may offset to the lower-left compared with its current position in FIG. 6, which would reduce the total lengths of electrical connections needed.

Figure 7:
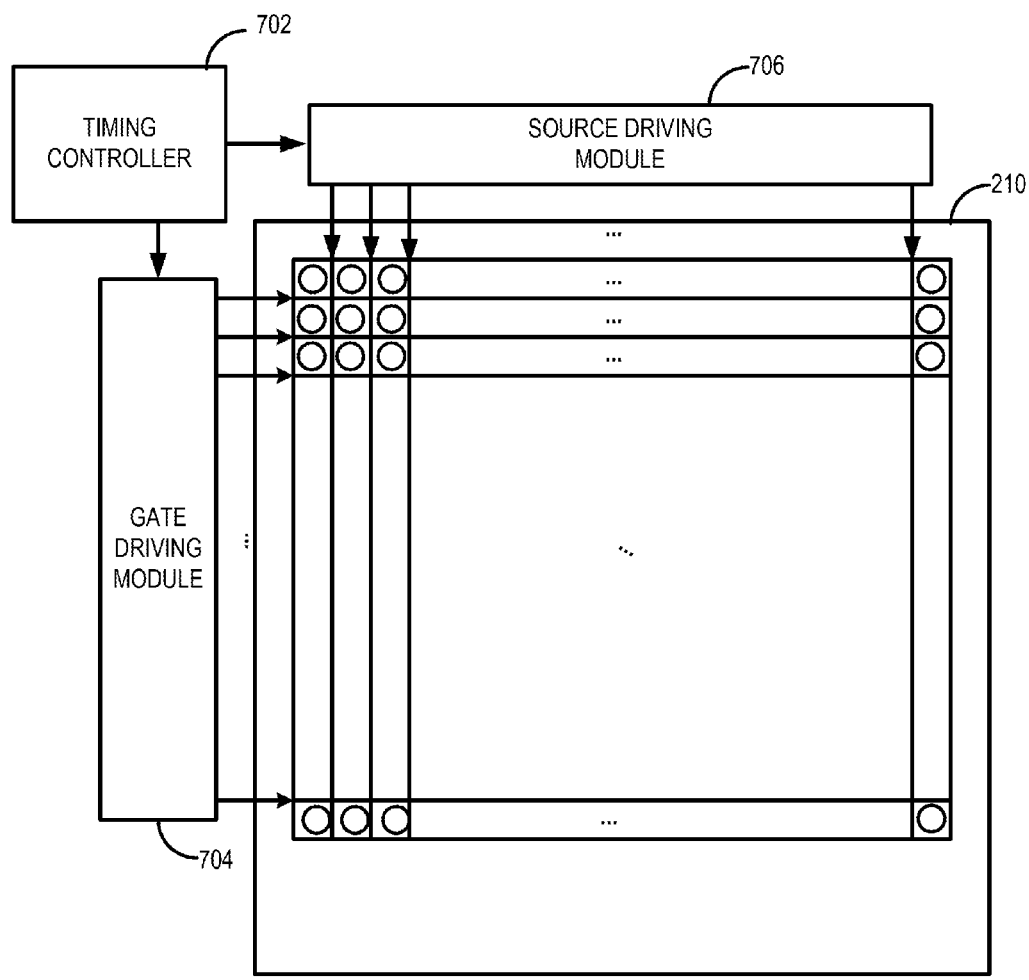
FIG. 7 is a plan-view diagram illustrating one example of the display of the apparatus shown in FIG. 1 in accordance with one embodiment set forth in the disclosure.

FIG. 7 is a plan-view diagram illustrating one example of the display of the apparatus shown in FIG. 1 in accordance with one embodiment set forth in the disclosure. In this example, the control logic 104 of the display 102 includes a timing controller (TCON) 702, a gate driving module 704, and a source driving module 706. The TCON 702 is configured to receive the display data 106 in multiple frames. The display data 106 is received in consecutive frames at any frame rate used in the art, such as 30, 60, or 72 Hz. Based on received display data 106, the TCON 302 provides control signals to the gate driving module 704 and source driving module 706, respectively. The gate driving module 704 in this example applies scan voltage signals, which are generated based on the control signals from the TCON 302, to the gate lines (a.k.a. scan lines) for each row of subpixels in a sequence. The gate driving signals are applied to the gate electrode of each TFT to turn on the corresponding TFT by applying a gate voltage so that the data for the corresponding subpixel may be written by the source driving module 706. The gate driving module 704 in this example may include a digital-analog converter (DAC) and multiplexers (MUX) for converting the digital control signals to analog scan voltage signals and applying the scan voltage signals to the scan lines for each row of subpixels according to the preset scanning sequences. It is understood that although one gate driving module 704 is illustrated in FIG. 7, in other examples, multiple gate driving modules may work in conjunction with each other to scan the subpixel rows.

The source driving module 706 in this example is configured to write the display data 106 into the array of subpixels based on the control signals from the TCON 702 in each frame. For example, the source driving module 706 may simultaneously apply the source voltage signals to the source lines (a.k.a. data lines) for each column of subpixels. That is, the source driving module 706 may include a DAC, MUX, and arithmetic circuit for controlling, based on the control signals, a timing of application of voltage to the source electrode of each TFT and a magnitude of the applied voltage according to gradations of the display data 106. It is understood that although one source driving module 706 is illustrated in FIG. 7, in other examples, multiple source driving modules may work in conjunction with each other to apply source voltage signals to the data lines for each column of subpixels.

Figure 8:
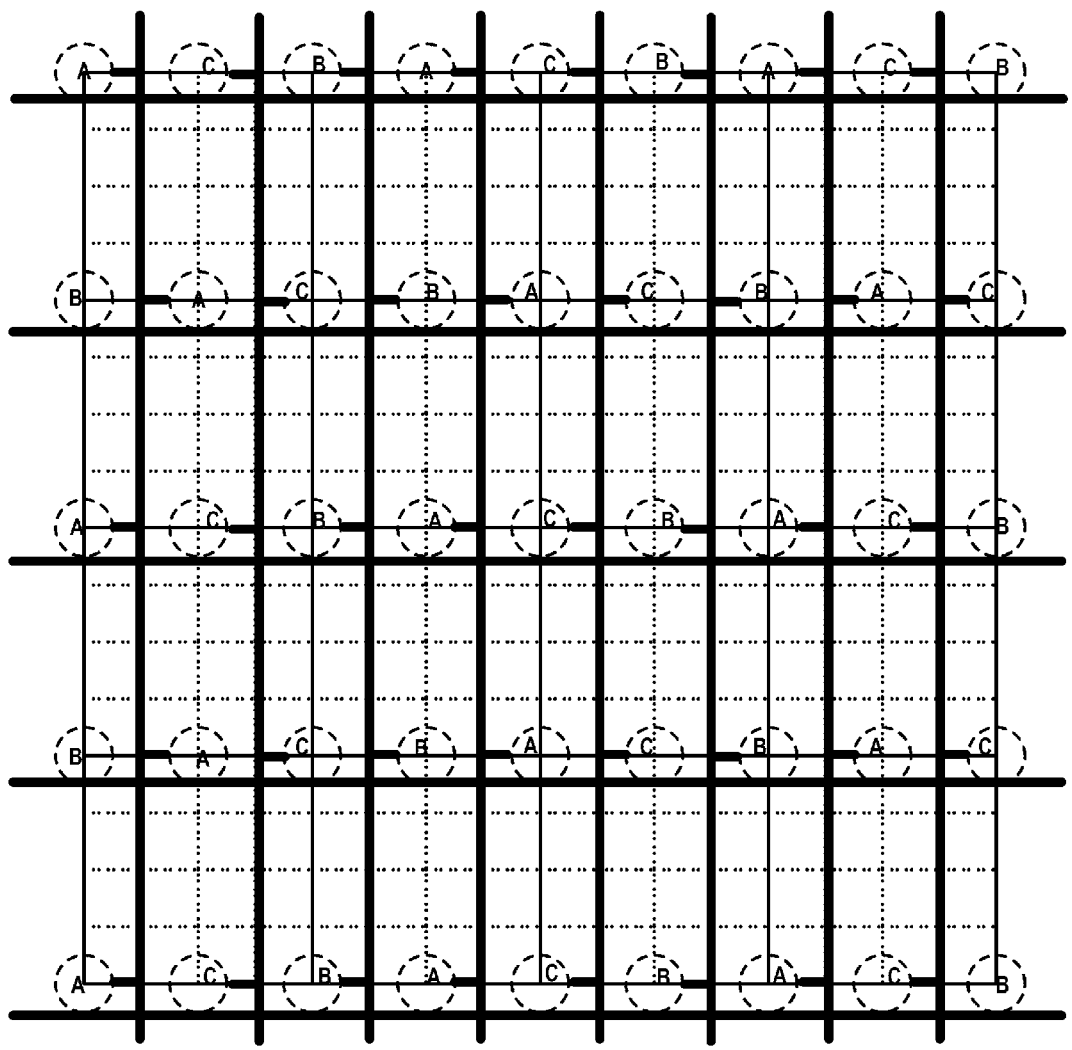
FIG. 8 is a depiction of electrical connections between gate and source lines and driving elements of a display in accordance with one embodiment set forth in the disclosure.

FIG. 8 is a depiction of electrical connections between gate and source lines and driving elements of a display in accordance with one embodiment set forth in the disclosure. In FIG. 8, each vertical thick line represents one of the parallel source lines that electrically connects the source driving module 706 and a set of driving elements for transmitting a source voltage signal to the corresponding set of subpixels (e.g., OLEDs). Each horizontal thick line represents one of the parallel gate lines that electrically connects the gate driving module 704 and a set of driving elements for transmitting a scan voltage signal to the corresponding set of subpixels. The arrangement of gate and source lines in this embodiment applies to the same subpixel and driving element arrangements as shown in FIGS. 3, 5, and 6. Each dotted circle in FIG. 8 represents a driving element, and the letter "A," "B," or "C" inside each dotted circle represents the color of a subpixel driven by the corresponding driving element (the actual positions of each subpixel and the electrical connections between each subpixel and driving element are not shown in FIG. 8).

As shown in FIG. 8, each of the parallel gate lines in the horizontal axis is coupled to driving elements in a respective row of the array 500 of driving elements. Taking the first gate line from the top as an example, it is electrically connects to the gate electrodes of TFTs of each driving element in the first row (from the top) of the array 500. As discussed above with respect to FIG. 6, the driving elements in the first row of the array 500 are configured to drive subpixels in alternated colors A, C, and B. For the second gate line from the top, it is electrically connects to the gate electrodes of TFTs of each driving element in the second row from the top of the array 500. As discussed above with respect to FIG. 6, the driving elements in the second row of the array 500 are configured to drive subpixels in alternated colors B, A, and C.

As shown in FIG. 8, each of the parallel source lines in the vertical axis is arranged between two adjacent columns of the array 500 of driving elements and is coupled to driving elements in the two adjacent columns of the array 500 that are configured to drive subpixels in a same color. Driving elements in the two adjacent columns of the array 500 of driving elements are alternatively coupled to the source line therebetween.

Taking the first source line from the left as an example, it is arranged between the first and second columns from the left of the array 500 of driving elements. The first source line electrically connects to the source electrodes of TFTs of each driving element in the first and second columns of the array 500 that are configured to drive subpixels in color A. Driving elements in the first and second columns of the array 500 are alternatively coupled to the first source line therebetween. That is, a driving element for subpixel A in the first column of the array 500 is coupled to the first source line, then a driving element for subpixel A in the second column of the array 500 is coupled to the first source line. Another driving element for subpixel A in the first column of the array 500 is again coupled to the first source line, then another driving element for subpixel A in the second column of the array 500 is coupled to the first source line. Similarly, for the second source line from the left, it is arranged between the second and third columns from the left of the array 500 of driving elements. The second source line electrically connects to the source electrodes of TFTs of each driving element in the second and third columns of the array 500 that are configured to drive subpixels in color C. Driving elements in the second and third columns of the array 500 are alternatively coupled to the second source line therebetween. For the third source line from the left, it is arranged between the third and fourth columns from the left of the array 500 of driving elements. The third source line electrically connects to the source electrodes of TFTs of each driving element in the third and fourth columns of the array 500 that are configured to drive subpixels in color B. Driving elements in the third and fourth columns of the array 500 are alternatively coupled to the second source line therebetween.

Accordingly, a source line in this embodiment transmits a source voltage signal for subpixels only in the same color, which can reduce the power consumption of displays. Each source line in this embodiment (from left to right) transmits source voltage signals for subpixels in alternated colors, A, C, and B.

Figure 9:
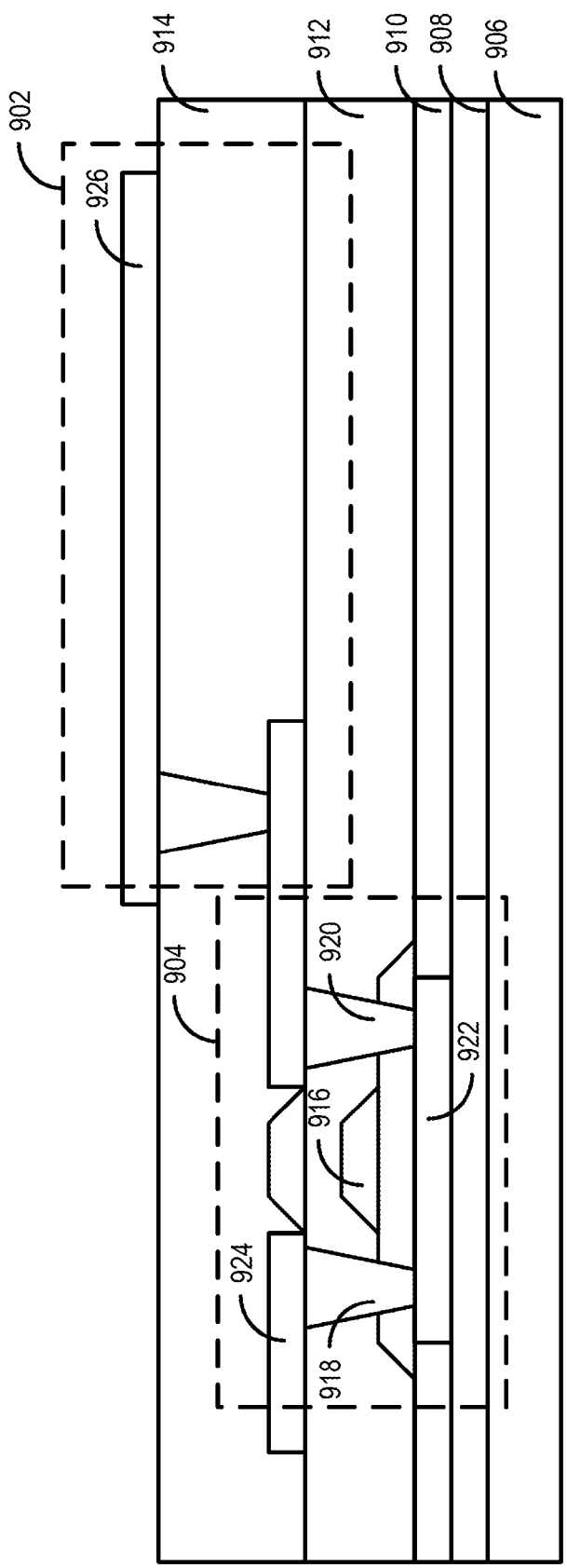
FIG. 9 is a side-view diagram illustrating one example of an OLED, a thin film transistor (TFT) and a source line in accordance with one embodiment set forth in the disclosure.

FIG. 9 is a side-view diagram illustrating one example of an OLED, an TFT and a source line in accordance with one embodiment set forth in the disclosure. As shown in FIG. 9, both an OLED 902 and a TFT 904 are fabricated on a glass substrate 906. Between the OLED 902, TFT 904, and glass substrate 906, various insulating layers are formed, including a buffer layer 908, a gate insulating layer 910, a source/drain insulating layer 912, and an anode insulating layer 914.

The TFT 904 in this example includes a gate electrode 916, a source electrode 918, a drain electrode 920, and a low-temperature polycrystalline silicon (LPTS) channel 922. The source electrode 918 is electrically connected to a source line 924, and the drain electrode 920 is electrically connected to an anode 926 of the OLED 902 (some parts of the OLED 902 are not shown in FIG. 9). The source line 924 corresponds to each vertical thick line in FIG. 8. As shown in FIG. 9, because the anode 926 of the OLED 902 and the source line 924 are not on the same plane, even some source lines shown in FIG. 8 and some electrical connections between the OLEDs and TFTs shown in FIG. 6 appear to be overlapped with each other in a plan-view, they do not physically contact with each other to form short circuit.

Also, integrated circuit design systems (e.g. work stations) are known that create wafers with integrated circuits based on executable instructions stored on a computer-readable medium such as but not limited to CDROM, RAM, other forms of ROM, hard drives, distributed memory, etc. The instructions may be represented by any suitable language such as but not limited to hardware descriptor language (HDL), Verilog or other suitable language. As such, the logic, units, and circuits described herein may also be produced as integrated circuits by such systems using the computer-readable medium with instructions stored therein.

For example, an integrated circuit with the aforedescribed logic, units, and circuits may be created using such integrated circuit fabrication systems. The computer-readable medium stores instructions executable by one or more integrated circuit design systems that causes the one or more integrated circuit design systems to design an integrated circuit. The designed integrated circuit includes an array of driving elements, a plurality of parallel gate lines along the horizontal axis, and a plurality of parallel source lines along the vertical axis. Each driving element is configured to drive a respective subpixel of an array of subpixels. Driving elements in each row of the array of driving elements are aligned. Driving elements in each column of the array of driving elements are aligned. Every two adjacent rows of the array of driving elements are offset by 4 units in the vertical axis. Every two adjacent columns of the array of driving elements are offset by 2 units in the horizontal axis. Driving elements in each row of the array of driving elements are configured to drive a same number of subpixels in the first, second, and third colors. Each of the plurality of parallel gate lines is coupled to driving elements in a respective row of the array of driving elements. Driving elements in each column of the array of driving elements are configured to drive a same number of subpixels in two colors of the first, second, and third colors. Each of the plurality of parallel source lines is arranged between two adjacent columns of the array of driving elements and is coupled to driving elements in the two adjacent columns of the array of driving elements that are configured to drive subpixels in a same color. Driving elements in the two adjacent columns of the array of driving elements are alternatively coupled to the source line therebetween. Each driving element of the array of driving elements includes one or more TFTs.

The above detailed description of the disclosure and the examples described therein have been presented for the purposes of illustration and description only and not by limitation. It is therefore contemplated that the present disclosure cover any and all modifications, variations or equivalents that fall within the spirit and scope of the basic underlying principles disclosed above and claimed herein.

What is claimed is:

1. An apparatus comprising:
   a display panel comprising:
      an array of subpixels arranged in columns and rows in a first, a second, and a third colors; and
      an array of driving elements arranged in columns and rows, each driving element configured to drive a respective subpixel of the array of subpixels, wherein
   subpixels in the first, second, and third colors are alternatively arranged in every three adjacent rows of the array of subpixels,
   every two adjacent rows of the array of subpixels are staggered with each other,
   a geometric center of a first subpixel in one of the first, second, and third colors and a geometric center of a second subpixel in a same color as the first subpixel are offset by 3 units in the horizontal axis and 4 units in the vertical axis, the first and second subpixels having a minimum distance among subpixels in the same color,
   driving elements in each row of the array of driving elements are aligned,
   driving elements in each column of the array of driving elements are aligned, and
   a first length of a first electrical connection between the first subpixel and a first driving element driving the first subpixel is different from a second length of a second electrical connection between the second subpixel and a second driving element driving the second subpixel.

2. The apparatus of claim 1, wherein
   the geometric center of the first subpixel and a geometric center of a third subpixel in the same color as the first subpixel are offset by 6 units in the horizontal axis and 0 unit in the vertical axis, the first and third subpixels having a minimum distance among subpixels in a same row of the array of subpixels; and the geometric center of the first subpixel and a geometric center of a fourth subpixel in the same color as the first subpixel are offset by 8 units in the vertical axis and 0 unit in the horizontal axis, the first and fourth subpixels having a minimum distance among subpixels in the same color in a same column of the array of subpixels.

3. The apparatus of claim 2, wherein
the array of subpixels includes a first, a second, and a third repeating groups;
each of the first, second, and third repeating groups is formed by the first, second, third, and fourth subpixels in respective one of the first, second, and third colors; and
each of the first, second, and third repeating groups is tiled across the display panel in a regular pattern.

4. The apparatus of claim 3, wherein
the first repeating group and each of the second and third repeating groups are offset by 8/3 units in the vertical axis and 0 unit in the horizontal axis, respectively; and
the second and third repeating groups are offset from the first repeating group in opposite directions of the vertical axis.

5. The apparatus of claim 3, wherein the first repeating group and each of the second and third repeating groups are offset by about (8/3+0.0209) units in the vertical axis and about 0.3334 unit in the horizontal axis, respectively; and
the second and third repeating groups are offset from the first repeating group in opposite directions of the vertical axis and are offset from the first repeating group in opposite directions of the horizontal axis.

6. The apparatus of claim 1, wherein
every two adjacent rows of the array of driving elements are offset by 4 units in the vertical axis; and
every two adjacent columns of the array of driving elements are offset by 2 units in the horizontal axis.

7. The apparatus of claim 6, wherein driving elements in each row of the array of driving elements are configured to drive a same number of subpixels in the first, second, and third colors.

8. The apparatus of claim 7, wherein
the display panel further comprises a plurality of parallel gate lines along the horizontal axis; and
each of the plurality of parallel gate lines is coupled to driving elements in a respective row of the array of driving elements.

9. The apparatus of claim 6, wherein driving elements in each column of the array of driving elements are configured to drive a same number of subpixels in two colors of the first, second, and third colors.

10. The apparatus of claim 9, wherein
the display panel further comprises a plurality of parallel source lines along the vertical axis; and
each of the plurality of parallel source lines is arranged between two adjacent columns of the array of driving elements and is coupled to driving elements in the two adjacent columns of the array of driving elements that are configured to drive subpixels in a same color.

11. The apparatus of claim 10, wherein driving elements in the two adjacent columns of the array of driving elements are alternatively coupled to the source line therebetween.

12. The apparatus of claim 10, wherein each of the plurality of parallel source lines is a straight line along the vertical axis.

13. The apparatus of claim 1, wherein the first, second, and third colors include red, green, and blue, respectively.

14. The apparatus of claim 1, wherein the first and second subpixels having the minimum distance among subpixels in the same color are in the adjacent rows and adjacent columns of the array of subpixels.

15. The apparatus of claim 1, wherein at least some of the subpixels and their respective driving elements are not aligned in the horizontal axis or the vertical axis.

16. The apparatus of claim 1, wherein the array of driving elements is offset to the lower-left compared with the array of subpixels.

17. The apparatus of claim 1, wherein each subpixel in the first color has a first size, each subpixel in the second color has a second size, each subpixel in the third color has a third size, and the first, second, and third sizes are different from one another.

18. An apparatus comprising:
a display comprising:
a display panel having
a light emitting layer comprising an array of organic light emitting diodes (OLEDs) arranged in columns and rows in a first, a second, and a third colors, and
a driving circuit layer comprising an array of driving elements arranged in columns and rows, each driving element configured to drive a respective OLED of the array of OLEDs; and
control logic operatively coupled to the display and configured to receive display data and convert the display data into control signals for driving the array of OLEDs via the array of driving elements, wherein
OLEDs in the first, second, and third colors are alternatively arranged in every three adjacent rows of the array of OLEDs,
every two adjacent rows of the array of OLEDs are staggered with each other,
a geometric center of a first OLED in one of the first, second, and third colors and a geometric center of a second OLED in a same color as the first OLED are offset by 3 units in the horizontal axis and 4 units in the vertical axis, the first and second OLEDs having a minimum distance among OLEDs in the same color,
driving elements in each row of the array of driving elements are aligned,
driving elements in each column of the array of driving elements are aligned, and
a first length of a first electrical connection between the first OLED and a first driving element driving the first OLED is different from a second length of a second electrical connection between the second OLED and a second driving element driving the second OLED.

19. The apparatus of claim 18, wherein
the geometric center of the first OLED and a geometric center of a third OLED in the same color as the first OLED are offset by 6 units in the horizontal axis and 0 unit in the vertical axis, the first and third OLEDs having a minimum distance among OLEDs in a same row of the array of OLEDs; and
the geometric center of the first OLED and a geometric center of a fourth OLED in the same color as the first OLED are offset by 8 units in the vertical axis and 0 unit in the horizontal axis, the first and fourth OLEDs having a minimum distance among OLEDs in the same color in a same column of the array of OLEDs.

20. The apparatus of claim 19, wherein
the array of OLEDs includes a first, a second, and a third repeating groups;

each of the first, second, and third repeating groups is formed by the first, second, third, and fourth OLEDs in respective one of the first, second, and third colors; and each of the first, second, and third repeating groups is tiled across the display panel in a regular pattern.

21. The apparatus of claim 20, wherein
the first repeating group and each of the second and third repeating groups are offset by 8/3 units in the vertical axis and 0 unit in the horizontal axis, respectively; and
the second and third repeating groups are offset from the first repeating group in opposite directions of the vertical axis.

22. The apparatus of claim 20, wherein
the first repeating group and each of the second and third repeating groups are offset by about (8/3+0.0209) units in the vertical axis and about 0.3334 unit in the horizontal axis, respectively; and
the second and third repeating groups are offset from the first repeating group in opposite directions of the vertical axis and are offset from the first repeating group in opposite directions of the horizontal axis.

23. The apparatus of claim 20, wherein
every two adjacent rows of the array of driving elements are offset by 4 units in the vertical axis; and
every two adjacent columns of the array of driving elements are offset by 2 units in the horizontal axis.

24. The apparatus of claim 23, wherein driving elements in each row of the array of driving elements are configured to drive a same number of OLEDs in the first, second, and third colors.

25. The apparatus of claim 24, wherein
the display panel further comprises a plurality of parallel gate lines along the horizontal axis; and
each of the plurality of parallel gate lines is coupled to driving elements in a respective row of the array of driving elements.

26. The apparatus of claim 23, wherein driving elements in each column of the array of driving elements are configured to drive a same number of OLEDs in two colors of the first, second, and third colors.

27. The apparatus of claim 26, wherein
the display panel further comprises a plurality of parallel source lines along the vertical axis; and
each of the plurality of parallel source lines is arranged between two adjacent columns of the array of driving elements and is coupled to driving elements in the two adjacent columns of the array of driving elements that are configured to drive OLEDs in a same color.

28. The apparatus of claim 27, wherein driving elements in the two adjacent columns of the array of driving elements are alternatively coupled to the source line therebetween.

29. The apparatus of claim 18, wherein each driving element of the array of driving elements includes one or more thin film transistors (TFTs).

* * * * *